US011961695B2

United States Patent
Kim et al.

(10) Patent No.: US 11,961,695 B2
(45) Date of Patent: Apr. 16, 2024

(54) SUBSTRATE TREATING APPARATUS, ION IMPLANTATION APPARATUS, AND ION IMPLANTATION METHOD

(71) Applicant: SEMES CO., LTD., Cheonan-si (KR)

(72) Inventors: Doyeon Kim, Yongin-si (KR); Hyun Yoon, Hwaseong-si (KR); Ho Jong Hwang, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 317 days.

(21) Appl. No.: 17/409,840

(22) Filed: Aug. 24, 2021

(65) Prior Publication Data
US 2022/0059309 A1    Feb. 24, 2022

(30) Foreign Application Priority Data
Aug. 24, 2020  (KR) .................. 10-2020-0106511

(51) Int. Cl.
*H01J 37/02* (2006.01)
*H01J 37/20* (2006.01)
*H01J 37/317* (2006.01)
*H01L 21/687* (2006.01)

(52) U.S. Cl.
CPC ............ *H01J 37/026* (2013.01); *H01J 37/20* (2013.01); *H01J 37/3171* (2013.01); *H01L 21/6875* (2013.01); *H01J 2237/0044* (2013.01); *H01J 2237/2007* (2013.01)

(58) Field of Classification Search
CPC ...... H01J 37/026; H01J 37/20; H01J 37/3171; H01J 2237/0044; H01J 2237/2007; H01J 2237/20214; H01J 2237/31701; H01J 2237/31708; H01J 37/3244; H01L 21/6875; H01L 21/67051; H01L 21/68728; H01L 21/68764; H01L 21/68785; H01L 21/67017; H01L 21/68742

See application file for complete search history.

(56) References Cited

U.S. PATENT DOCUMENTS

| | | | |
|---|---|---|---|
| 2016/0280551 A1* | 9/2016 | Hasegawa | C01B 32/19 |
| 2020/0114994 A1* | 4/2020 | Smith | B60G 17/016 |
| 2021/0340095 A1* | 11/2021 | Sato | C07D 207/04 |

FOREIGN PATENT DOCUMENTS

| | | | |
|---|---|---|---|
| CN | 1313409 | 9/2001 | |
| CN | 105244300 | 1/2016 | |
| CN | 105593976 | 5/2016 | |
| CN | 106256016 A * | 12/2016 | ............ B24B 37/04 |
| CN | 106328489 | 1/2017 | |
| CN | 112222062 A * | 1/2021 | |
| JP | 03075370 | 3/1991 | |
| JP | 1995003137 | 1/1995 | |

(Continued)

OTHER PUBLICATIONS

Office Action from the Japan Patent Office dated Jul. 26, 2022.
(Continued)

*Primary Examiner* — Abdullah A Riyami
*Assistant Examiner* — Syed M Kaiser

(57) ABSTRACT

An apparatus for treating a substrate includes a process chamber that performs a liquid treatment process by dispensing a treatment liquid onto the substrate, and components provided in the process chamber. A surface of at least one of the components is formed of a material containing an ion-implanted fluorine resin.

20 Claims, 11 Drawing Sheets

(56) References Cited

FOREIGN PATENT DOCUMENTS

| | | | |
|---|---|---|---|
| JP | 1998259262 | | 9/1998 |
| JP | 1999283914 | | 10/1999 |
| JP | 2001244318 | | 9/2001 |
| JP | 2002343696 | | 11/2002 |
| JP | 2006073909 | | 3/2006 |
| JP | 2008021744 | | 1/2008 |
| JP | 2015002261 | | 1/2015 |
| JP | 2018125371 | | 8/2018 |
| JP | 2018125407 A * | | 8/2018 |
| KR | 20040009574 | | 1/2004 |
| KR | 10-2004-0039588 | | 5/2004 |
| KR | 100954484 | | 2/2009 |
| KR | 10-2013-0111150 | | 10/2013 |
| KR | 20150046148 A * | | 4/2015 |
| KR | 20160043043 A * | | 4/2016 |
| KR | 20170014327 A * | | 2/2017 |
| KR | 1020170014327 | | 2/2017 |
| KR | 101911574 B1 * | | 10/2018 |
| KR | 10-2018-0126866 | | 11/2018 |
| KR | 1020180122658 | | 11/2018 |
| KR | 10-2020-0072957 | | 6/2020 |
| WO | 2013147037 | | 10/2013 |
| WO | 2018066528 | | 4/2018 |
| WO | 2019017489 | | 1/2019 |

OTHER PUBLICATIONS

Office Action from Korean Intellectual Property Office dated Mar. 20, 2023.
Office Action from the Japan Patent Office dated Feb. 21, 2023.
Office Action from the China National Intellectual Property Administration dated Oct. 30, 2023.

\* cited by examiner

SUBSTRATE TREATING APPARATUS, ION IMPLANTATION APPARATUS, AND ION IMPLANTATION METHOD

CROSS-REFERENCE TO RELATED APPLICATIONS

A claim for priority under 35 U.S.C. § 119 is made to Korean Patent Application No. 10-2020-0106511 filed on Aug. 24, 2020, in the Korean Intellectual Property Office, the entire contents of which are hereby incorporated by reference.

BACKGROUND

Embodiments of the inventive concept described herein relate to a substrate treating apparatus, an ion implantation apparatus, and an ion implantation method.

In general, a liquid treatment process of dispensing a treatment liquid onto a substrate, such as a wafer, is widely used to manufacture semiconductor elements. The liquid treatment process may include, for example, a coating process of forming a liquid film on the substrate by dispensing a light-sensitive liquid onto the substrate, a cleaning process of removing contaminants (e.g., particles, organic contaminants, metal contaminants, and the like) remaining on the substrate by dispensing a cleaning solution onto the substrate, and the like.

The treatment liquid (e.g., an acidic or alkaline chemical, an organic solvent such as IPA, DIW, or the like) used in the liquid treatment process has high reactivity. Furthermore, in the process of treating the substrate, heat is generated by friction of the treatment liquid with the substrate. Therefore, a component (e.g., a bowl or a chuck) provided in a substrate treating apparatus is formed of a fluorine resin or an engineering plastic material to resist the treatment liquid and high temperature. The component formed of a fluorine resin or an engineering plastic material has excellent chemical resistance or heat resistance.

However, the component formed of a fluorine resin or an engineering plastic material has a surface resistance of about 1 T Ohms to about 10 T Ohms. The surface resistance does not meet the semiconductor equipment and materials international (SEMI) standards. Furthermore, in the liquid treatment process, static electricity is easily generated in a process in which the treatment liquid generates friction with the substrate or in a process in which the treatment liquid is scattered from the component. The component formed of a fluorine resin or an engineering plastic material is very vulnerable to the static electricity. For example, fluorine resins having the lowest ranking in the triboelectric series are easily electrified with static electricity. Because the static electricity causes arcing or adsorption of particles, it is important to prevent static electrification or appropriately remove the static electricity.

To appropriately remove static electricity, a method of manufacturing a component with a metallic material may be considered. However, the component formed of a metallic material is not appropriate due to its poor corrosion resistance and heat resistance to the treatment liquid.

In recent years, methods of manufacturing a component by mixing a conductive polymer with carbon (carbon black, CNT, graphene, graphite, or the like) or polypropylene have been proposed. One example of the methods is disclosed in Japanese Patent Publication No. 1999-283914. A cup formed of an antistatic plastic material obtained by mixing a conductive polymer with polypropylene is disclosed in Japanese Patent Publication No. 1999-283914. However, in the case of a component manufactured by mixing a conductive polymer with carbon or polypropylene, an elution phenomenon in which powder comes out of the component occurs easily. The powder generated by the elution phenomenon may act as a contaminant in treatment of a substrate.

SUMMARY

Embodiments of the inventive concept provide a substrate treating apparatus for efficiently treating a substrate.

Further, embodiments of the inventive concept provide a substrate treating apparatus for minimizing generation of static electricity in a process of treating a substrate.

Furthermore, embodiments of the inventive concept provide a substrate treating apparatus for effectively removing static electricity generated in a process of treating a substrate.

Moreover, embodiments of the inventive concept provide an ion implantation apparatus and method for manufacturing a component that has chemical resistance and heat resistance of a fluorine resin or plastic and that is capable of minimizing generation of static electricity.

In addition, embodiments of the inventive concept provide an ion implantation apparatus and method for manufacturing a component that has chemical resistance and heat resistance of a fluorine resin or plastic and that is capable of effectively removing generated static electricity.

The technical problems to be solved by the inventive concept are not limited to the aforementioned problems, and any other technical problems not mentioned herein will be clearly understood from the following description by those skilled in the art to which the inventive concept pertains.

According to an embodiment, an apparatus for treating a substrate includes a process chamber that performs a liquid treatment process by dispensing a treatment liquid onto the substrate, and components provided in the process chamber. A surface of at least one of the components is formed of a material containing an ion-implanted fluorine resin.

According to an embodiment, the apparatus may further include a treatment vessel provided in a container shape that is open at the top, the treatment vessel having a treatment space in which the substrate is treated, and the component may be the treatment vessel.

According to an embodiment, the treatment vessel may be electrically connected with a lifting unit that moves the treatment vessel in an up/down direction and that is grounded.

According to an embodiment, the treatment vessel may include a sidewall portion coupled with the lifting unit and an inclined portion extending from the sidewall portion in an upwardly inclined direction, and an amount of ions implanted in a surface of the inclined portion and an amount of ions implanted in a surface of the sidewall portion may differ from each other.

According to an embodiment, the amount of ions implanted in the surface of the inclined portion may be less than the amount of ions implanted in the surface of the sidewall portion.

According to an embodiment, the apparatus may further include a support plate that supports the substrate in the process chamber and a chuck pin that is installed on the support plate and that holds the substrate, and the component may be the support plate.

According to an embodiment, the chuck pin may be grounded, and the support plate may be electrically connected with the chuck pin.

According to an embodiment, an amount of ions implanted in a central area of the support plate when viewed from above and an amount of ions implanted in an edge area of the support plate may differ from each other.

According to an embodiment, the amount of ions implanted in the central area may be less than the amount of ions implanted in the edge area.

According to an embodiment, the chuck pin may include a contact portion that makes contact with the substrate and a ground portion that is electrically connected with the contact portion and that is grounded, and resistances of the contact portion and the ground portion may differ from each other.

According to an embodiment, the resistance of the contact portion may be higher than the resistance of the ground portion.

According to an embodiment, the apparatus may further include a support unit that supports the substrate in the process chamber and a nozzle that dispenses the treatment liquid onto the support unit, and the component may be the nozzle.

According to an embodiment, the nozzle may be grounded, and a discharge passage that is formed in the nozzle and through which the treatment liquid flows may be subjected to ion implantation.

According to an embodiment, an apparatus for treating a substrate includes a treatment vessel having a treatment space, a support unit that supports the substrate in the treatment space and that has a support plate, and a liquid dispensing unit including a nozzle that dispenses a treatment liquid onto the substrate supported on the support unit. At least one of the treatment vessel, the support plate, or the nozzle is formed of a material containing a fluorine resin or plastic, and a surface of the at least one of the treatment vessel, the support plate, or the nozzle is subjected to ion implantation to have a dissipative property.

According to an embodiment, the treatment vessel may be electrically connected with a lifting unit that moves the treatment vessel in an up/down direction and that is grounded, and surface resistance of the treatment vessel may be gradually decreased with an approach to an area where the treatment vessel is coupled with the lifting unit.

According to an embodiment, surface resistance of a central area of the support plate when viewed from above may be higher than surface resistance of an edge area of the support plate.

According to an embodiment, the support unit may include a chuck pin that is installed on the support plate and that holds the substrate, and the chuck pin may be grounded and electrically connected with the support plate.

According to an embodiment, the chuck pin may include a contact portion that makes contact with the substrate and a ground portion that is electrically connected with the contact portion and is grounded, and resistance of the contact portion may be higher than resistance of the ground portion.

According to an embodiment, an apparatus for treating a substrate includes a treatment vessel having a treatment space, a support unit that supports the substrate in the treatment space and that has a support plate, and a liquid dispensing unit including a nozzle that dispenses a treatment liquid onto the substrate supported on the support unit. The treatment vessel and the support plate are formed of a material containing a fluorine resin and are subjected to ion implantation to have a surface resistance of 1 M Ohms to 1 G Ohms.

According to an embodiment, the treatment vessel may be electrically connected with a lifting unit that moves the treatment vessel in an up/down direction and that is grounded. The treatment vessel may include a sidewall portion coupled with the lifting unit and an inclined portion extending from the sidewall portion in an upwardly inclined direction. Surface resistance of the inclined portion may be higher than surface resistance of the sidewall portion.

According to an embodiment, an ion implantation method includes supporting, on a rotary chuck, a component provided in a process chamber that performs liquid treatment on a substrate, rotating the component in one direction by operating the rotary chuck, and emitting an ion beam containing gas or solid ions to the rotating component.

According to an embodiment, the ion beam may be emitted to the component from a position eccentrically located off the center of rotation of the component when viewed from above.

According to an embodiment, the ion beam may be emitted to the component such that, when viewed from above, an amount of ions implanted in a central area of the component and an amount of ions implanted in an edge area of the component differ from each other.

According to an embodiment, the component may be one of a treatment vessel having a treatment space, a support plate provided in the treatment space, or a nozzle that dispenses a treatment liquid onto the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
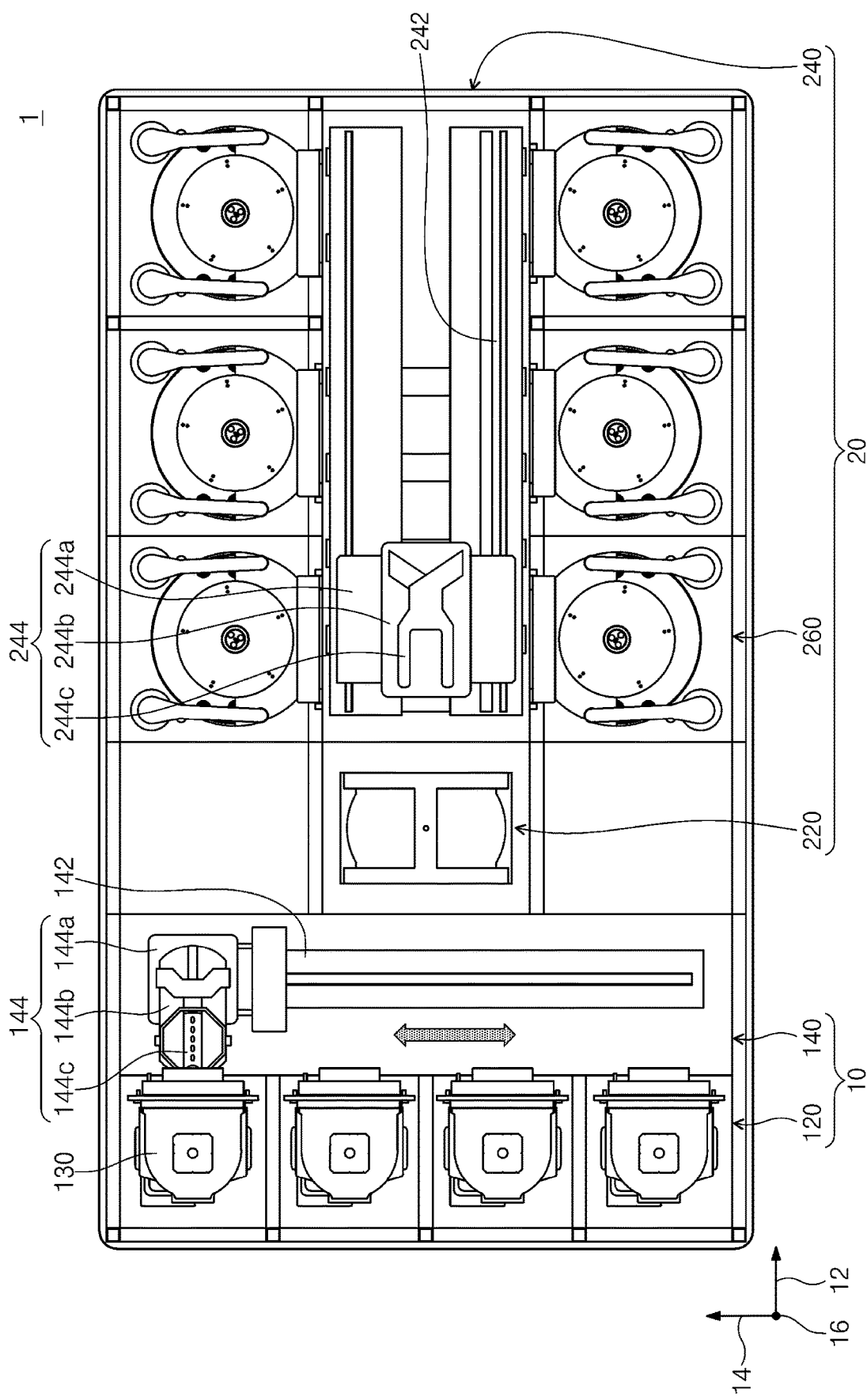
FIG. 1 is a plan view illustrating substrate treating equipment according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 1 to 14.

FIG. 1 is a plan view illustrating substrate treating equipment according to an embodiment of the inventive concept.

Referring to FIG. 1, the substrate treating equipment 1 includes an index module 10 and a process module 20. The index module 10 includes a load port 120 and a transfer frame 140. The load port 120, the transfer frame 140, and the process module 20 are sequentially arranged in a row. Hereinafter, a direction in which the load port 120, the transfer frame 140, and the process module 20 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

A carrier 130 having substrates W received therein is seated on the load port 120. A plurality of load ports 120 may be provided. The load ports 120 may be disposed in a row along the second direction 14. The number of load ports 120 may be increased or decreased depending on process efficiency and footprint of the process module 20. The carrier 130 has a plurality of slots (not illustrated) formed therein in which the substrates W are received in a state of being horizontally disposed with respect to the ground. A front opening unified pod (FOUP) may be used as the carrier 130.

The process module 20 includes a buffer unit 220, a transfer chamber 240, and process chambers 260. The transfer chamber 240 is disposed such that the lengthwise direction thereof is parallel to the first direction 12. The process chambers 260 are disposed on opposite sides of the transfer chamber 240. On the opposite sides of the transfer chamber 240, the process chambers 260 are provided to be symmetric with respect to the transfer chamber 240. A plurality of process chambers 260 are provided on one side of the transfer chamber 240. Some of the process chambers 260 are disposed along the lengthwise direction of the transfer chamber 240. Furthermore, other process chambers 260 are stacked one above another. That is, the process chambers 260 may be disposed in an A×B array on the one side of the transfer chamber 240. Here, "A" denotes the number of process chambers 260 provided in a row along the first direction 12, and "B" denotes the number of process chambers 260 provided in a column along the third direction 16. In a case where four or six process chambers 260 are provided on the one side of the transfer chamber 240, the process chambers 260 may be disposed in a 2×2 or 3×2 array. The number of process chambers 260 may be increased or decreased. Alternatively, the process chambers 260 may be provided on only the one side of the transfer chamber 240. In another case, the process chambers 260 may be disposed in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) formed therein in which the substrates W are received. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carrier 130 seated on the load port 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and an index arm 144c. The base 144a is movable along the index rail 142. The body 144b is coupled to the base 144a. The body 144b is movable on the base 144a along the third direction 16. Furthermore, the body 144b is rotatable on the base 144a. The index arm 144c is coupled to the body 144b and is movable forward and backward relative to the body 144b. A plurality of index arms 144c may be provided. The index arms 144c may be individually driven. The index arms 144c are stacked one above another with a spacing gap therebetween along the third direction 16. Some of the index arms 144c may be used to transfer the substrates W from the process module 20 to the carrier 130, and the other index arms 144c may be used to transfer the substrates W from the carrier 130 to the process module 20. Accordingly, particles generated from the substrates W to be treated may be prevented from adhering to the treated substrates W in a process in which the index robot 144 transfers the substrates W between the carrier 130 and the process module 20.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244a, a body 244b, and a main arm 244c. The base 244a is movable along the guide rail 242. The body 244b is coupled to the base 244a. The body 244b is movable on the base 244a along the third direction 16. Furthermore, the body 244b is rotatable on the base 244a. The main arm 244c is coupled to the body 244b and is movable forward and backward relative to the body 244b. A plurality of main arms 244c may be provided. The main arms 244c may be individually driven. The main arms 244c are stacked one above another with a spacing gap therebetween along the third direction 16.

The process chambers 260 may be chambers for performing liquid treatment processes by dispensing treatment liquids L onto the substrates W. For example, the process chambers 260 may be equipped with substrate treating apparatuses 300 for performing the liquid treatment processes on the substrates W. The substrate treating apparatuses 300 may have different structures depending on the types of liquid treatment processes performed by the substrate treating apparatuses 300. For example, the substrate treating apparatuses 300 may have different structures depending on the types of treatment liquids L dispensed onto the substrates W. Alternatively, the substrate treating apparatuses 300 in the respective process chambers 260 may have the same structure. Selectively, the process chambers 260 may be divided into a plurality of groups. The substrate treating apparatuses 300 in the process chambers 260 belonging to the same group may have the same structure, and the substrate treating apparatuses 300 in the process chambers 260 belonging to different groups may have different structures.

The substrate treating apparatuses 300 may perform the liquid treatment processes on the substrates W by dispensing the treatment liquids L onto the substrates W. In this embodiment, the liquid treatment processes for the substrates W may be cleaning processes. However, without being limited thereto, the liquid treatment processes may be various well-known processes (e.g., a coating process) for treating the substrates W by dispensing the treatment liquids L onto the substrates W.

Figure 2:
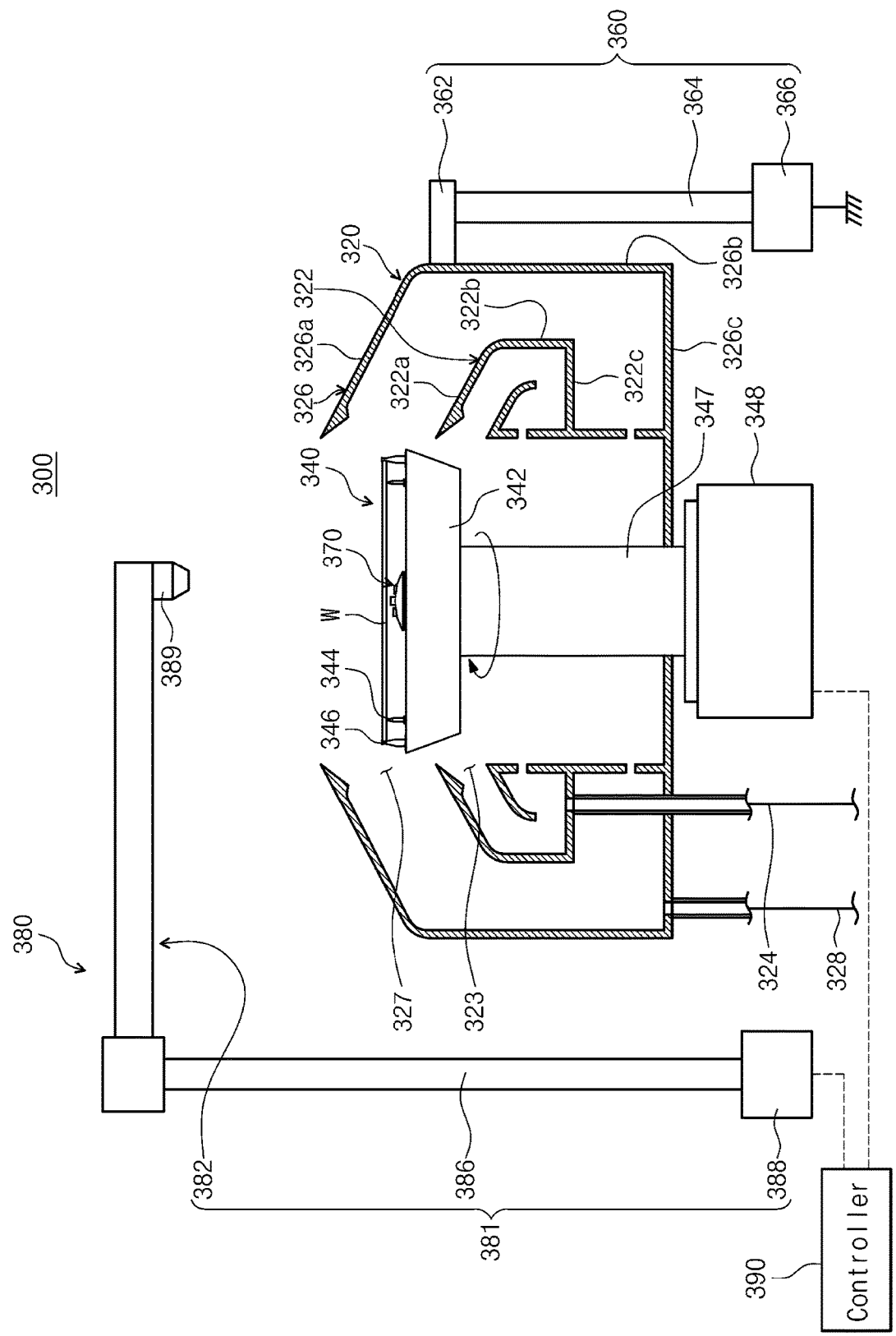
FIG. 2 is a view illustrating a substrate treating apparatus of FIG. 1.

FIG. 2 is a view illustrating a substrate treating apparatus of FIG. 1. Referring to FIG. 2, the substrate treating apparatus 300 includes a treatment vessel 320, a support unit 340, a lifting unit 360, a lower fluid dispensing unit 370, an upper fluid dispensing unit 380, and a controller 390.

The treatment vessel 320 may be provided in the process chamber 260. The treatment vessel 320 may provide a treatment space in which a substrate W is treated. The treatment vessel 320 may have a container shape that is open at the top. The treatment vessel 320 may be a bowl.

The treatment vessel 320 may include an inner recovery bowl 322 and an outer recovery bowl 326. The inner recovery bowl 322 and the outer recovery bowl 326 may recover different treatment liquids L used for processes. The inner recovery bowl 322 has an annular ring shape that surrounds the support unit 340 when viewed from above, and the outer recovery bowl 326 has an annular ring shape that surrounds the inner recovery bowl 322 when viewed from above.

The inner recovery bowl 322 may have a first inclined portion 322a, a first sidewall portion 322b, and a first bottom portion 322c. The first sidewall portion 322b may vertically extend from the first bottom portion 322c. For example, the first sidewall portion 322b may extend upward from the first bottom portion 322c. Furthermore, the first inclined portion 322a may extend from the first sidewall portion 322b in an upwardly inclined direction toward a support plate 342 that will be described below.

The outer recovery bowl 326 may have a second inclined portion 326a, a second sidewall portion 326b, and a second bottom portion 326c. The second sidewall portion 326b may vertically extend from the second bottom portion 326c. For example, the second sidewall portion 326b may extend upward from the second bottom portion 326c. Furthermore, the second inclined portion 326a may extend from the second sidewall portion 326b in an upwardly inclined direction toward the support plate 342 that will be described below.

An inner space of the inner recovery bowl 322 and the first inclined portion 322a may form a first inlet 323 through which a treatment liquid L is introduced into the inner recovery bowl 322. The first inclined portion 322a and the second inclined portion 326a may form a second inlet 327 through which a treatment liquid L is introduced into the outer recovery bowl 326. According to an embodiment, the inlets 323 and 327 may be located at different heights. Furthermore, recovery lines 324 and 328 are connected to the bottom portions 322c and 326c of the recovery bowls 322 and 326, respectively. The treatment liquids L introduced into the recovery bowls 322 and 326 may be supplied to an external treatment liquid regeneration system (not illustrated) through the recovery lines 324 and 328 and may be regenerated by the treatment liquid regeneration system.

The support unit 340 supports the substrate W in the treatment space. The support unit 340 supports and rotates the substrate W during a process. The support unit 340 includes the support plate 342, a support pin 344, a chuck pin 346, and rotary drive members 347 and 348. The support plate 342 has a substantially circular plate shape and has an upper surface and a lower surface. The lower surface has a smaller diameter than the upper surface. The upper surface and the lower surface are located such that the central axes thereof are in agreement with each other. The support pin 344 and the chuck pin 346 may be installed on the support plate 342. The support pin 344 and the chuck pin 346 may support a lateral portion and a rear surface of the substrate W, respectively. That is, the support plate 342 may support the substrate W via the support pin 344 and the chuck pin 346.

A plurality of support pins 344 may be provided. The support pins 344 may be disposed on an edge portion of the upper surface of the support plate 342 so as to be spaced apart from each other at predetermined intervals. The support pins 344 may protrude upward from the support plate 342. The support pins 344 may be disposed to form an annular ring shape as a whole by a combination thereof. The support pins 344 may support an edge portion of the rear surface of the substrate W such that the substrate W is spaced apart from the upper surface of the support plate 342 by a predetermined distance.

The chuck pin 346 may be installed on the support plate 342. The chuck pin 346 may hold the lateral portion of the substrate W. A plurality of chuck pins 346 may be provided. The chuck pins 346 may be located farther away from the center of the support plate 342 than the support pins 344. The chuck pins 346 may protrude upward from the upper surface of the support plate 342. The chuck pins 346 may support the lateral portion of the substrate W such that the substrate W does not deviate from a correct position to a side when the support plate 342 rotates. The chuck pins 346 are rectilinearly movable between outer positions and inner positions along a radial direction of the support plate 342. The outer positions are positions farther away from the center of the support plate 342 than the inner positions. The chuck pins 346 may be located in the outer positions when the substrate W is loaded onto or unloaded from the support plate 342, and the chuck pins 346 may be located in the inner positions when a process is performed on the substrate W. The inner positions are positions in which the chuck pins 346 and the lateral portion of the substrate W are brought into contact with each other, and the outer positions are positions in which the chuck pins 346 and the substrate W are spaced apart from each other.

Figure 3:
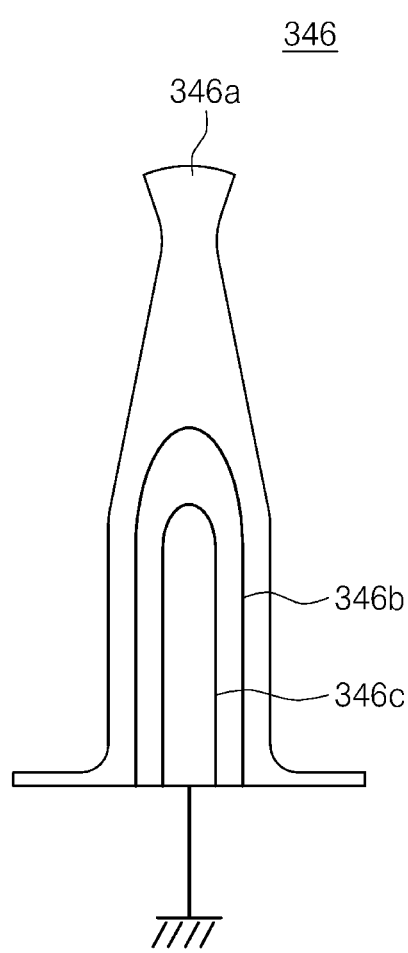
FIG. 3 is a sectional view illustrating a chuck pin of FIG. 2.

Each of the chuck pins 346 may be grounded as illustrated in FIG. 3. The chuck pin 346 may be electrically connected with the support plate 342. Accordingly, static electricity generated in a process of treating the substrate W may be removed through a ground path formed by the chuck pin 346. The chuck pin 346 may include a contact portion 346a that makes contact with the lateral portion of the substrate W, a ground portion 346c that is grounded, and a middle portion 346b provided between the contact portion 346a and the ground portion 346c. The contact portion 346a, the middle portion 346b, and the ground portion 346c may have different resistances. For example, resistance may be gradually decreased with an approach to a ground line. For example, the contact portion 346a may have a higher resistance than the middle portion 346b, and the middle portion 346b may have a higher resistance than the ground portion 346c. For example, the contact portion 346a may have a resistance of 1 M Ohms, the middle portion 346b may have a resistance of 1 K Ohms, and the ground portion 346c may have a resistance of 10 Ohms. Static electricity has a property of flowing in a direction toward a substrate having low resistance. That is, as the chuck pin 346 has a resistance gradient, static electricity generated in a substrate treating process may flow in a direction toward the ground line and may be more effectively removed.

The rotary drive members 347 and 348 rotate the support plate 342. The support plate 342 is rotatable about the central axis thereof by the rotary drive members 347 and 348. The rotary drive members 347 and 348 include a hollow shaft 347 and an actuator 348. The hollow shaft 347 has a cylindrical shape facing the third direction 16. An upper end of the hollow shaft 347 is fixedly coupled to the lower surface of the support plate 342. The actuator 348 provides a driving force to rotate the hollow shaft 347. The actuator 348 may be a motor. The actuator 348 may be a hollow motor having a hollow bore. The hollow shaft 347 is rotated by the actuator 348, and the support plate 342 is rotatable together with the hollow shaft 347.

The lifting unit 360 rectilinearly moves the treatment vessel 320 in an up-down direction. The height of the treatment vessel 320 relative to the support plate 342 is varied as the treatment vessel 320 is moved in the up-down direction. The lifting unit 360 lowers the treatment vessel 320 such that the support plate 342 protrudes upward from the treatment vessel 320 when the substrate W is loaded onto or unloaded from the support plate 342. Furthermore, while a process is performed, the lifting unit 360 adjusts the height of the treatment vessel 320 depending on the types of treatment liquids L dispensed onto the substrate W, such that the treatment liquids L are introduced into the preset recovery bowls 322 and 326. The lifting unit 360 includes a bracket 362, a movable shaft 364, and an actuator 366. The bracket 362 is fixedly attached to an outer wall of the treatment vessel 320, and the movable shaft 364 is fixedly coupled to the bracket 362 and is moved in the up-down direction by the actuator 366. The lifting unit 360 may independently adjust the heights of the inner recovery bowl 322 and the outer recovery bowl 326. Selectively, the lifting unit 360 may move the support plate 342 in the up-down direction.

The lifting unit 360 may be grounded. The lifting unit 360 may be electrically connected with the treatment vessel 320. Accordingly, static electricity that is likely to be generated by friction of the treatment liquids L with the treatment vessel 320 may be removed along a ground path formed by the lifting unit 360.

The upper fluid dispensing unit 380 may be a liquid dispensing unit that dispenses a treatment liquid L onto the substrate W. The upper fluid dispensing unit 380 dispenses the treatment liquid L onto an upper surface of the substrate W. The upper surface of the substrate W may be a patterned surface on which a pattern is formed. A plurality of upper fluid dispensing units 380 may be provided. The upper fluid dispensing units 380 may dispense different types of treatment liquids L onto the substrate W. Each of the upper fluid dispensing units 380 includes a moving member 381 and a nozzle 389.

The moving member 381 moves the nozzle 389 between a process position and a standby position. Here, the process position is defined as a position in which the nozzle 389 faces the substrate W supported on the support unit 340, and the standby position is defined as a position in which the nozzle 389 deviates from the process position. According to an embodiment, the process position includes a pre-treatment position and a post-treatment position. The pre-treatment position is a position in which the nozzle 389 dispenses a treatment liquid to a first dispensing position, and the post-treatment position is a position in which the nozzle 389 dispenses the treatment liquid to a second dispensing position. The first dispensing position may be a position closer to the center of the substrate W than the second dispensing position, and the second dispensing position may be a position including an end portion of the substrate W. Selectively, the second dispensing position may be an area adjacent to the end portion of the substrate W.

The moving member 381 includes a support shaft 386, an arm 382, and a drive member 388. The support shaft 386 is located on one side of the treatment vessel 320. The support shaft 386 has a rod shape, the lengthwise direction of which is parallel to the third direction 16. The support shaft 386 is rotatable by the drive member 388. The support shaft 386 is movable upward and downward. The arm 382 is coupled to an upper end of the support shaft 386. The arm 382 extends from the support shaft 386 at a right angle thereto. The nozzle 389 is fixedly coupled to an end of the arm 382. As the support shaft 386 is rotated, the nozzle 389 is able to swing together with the arm 382. The nozzle 389 may be moved between the process position and the standby position. Selectively, the arm 382 is movable forward and backward along the lengthwise direction thereof. When viewed from above, a path along which the nozzle 389 is moved may be in agreement with the central axis of the substrate W in the process position. For example, the treatment liquids may include a chemical, a rinsing solution, and an organic solvent. The chemical may be a liquid having a property of acid or base. The chemical may include sulfuric acid ($H_2SO_4$), phosphoric acid ($P_2O_5$), hydrofluoric acid (HF), and ammonium hydroxide ($NH_4OH$). The rinsing solution may be deionized water ($H_2O$). The organic solvent may be isopropyl alcohol (IPA).

The lower fluid dispensing unit 370 may clean and dry the lower surface of the substrate W. The lower fluid dispensing unit 370 may dispense a fluid to the lower surface of the substrate W. The lower surface of the substrate W may be an unpatterned surface that is opposite to the surface on which the pattern is formed. The lower fluid dispensing unit 370 may simultaneously dispense a liquid together with the upper fluid dispensing unit 380. The lower fluid dispensing unit 370 may be fixed so as not to be rotated.

The controller 390 may control the substrate treating apparatus 300. The controller 390 may control the substrate treating apparatus 300 such that the substrate treating apparatus 300 performs a liquid treatment process on the substrate W.

The treatment vessel 320, the support unit 340, the lifting unit 360, the upper fluid dispensing unit 380, and the lower fluid dispensing unit 370 described above may be examples of a component provided in the process chamber 260 that will be described below. For example, the treatment vessel 320, the nozzle 389, and the support plate 342 may be examples of a component to be described below.

A component provided in the process chamber 260 may be formed of a material containing a fluorine resin or plastic. For example, the component may be formed of a material containing ethylene tetrafluoroethylene (ETFE) or plastic. The component formed of a material containing a fluorine resin or plastic may be provided in a state in which a surface is subjected to ion implantation.

Figure 4:
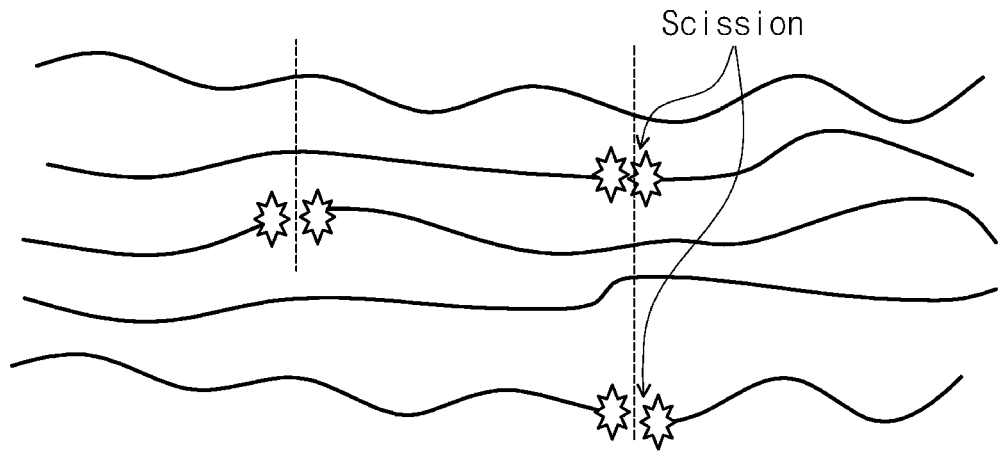
FIGS. 4 and 5 are views illustrating molecular bond breaking and cross-linking generated when ions are implanted in a surface of a component formed of a fluorine resin or a plastic material.
Figure 5:
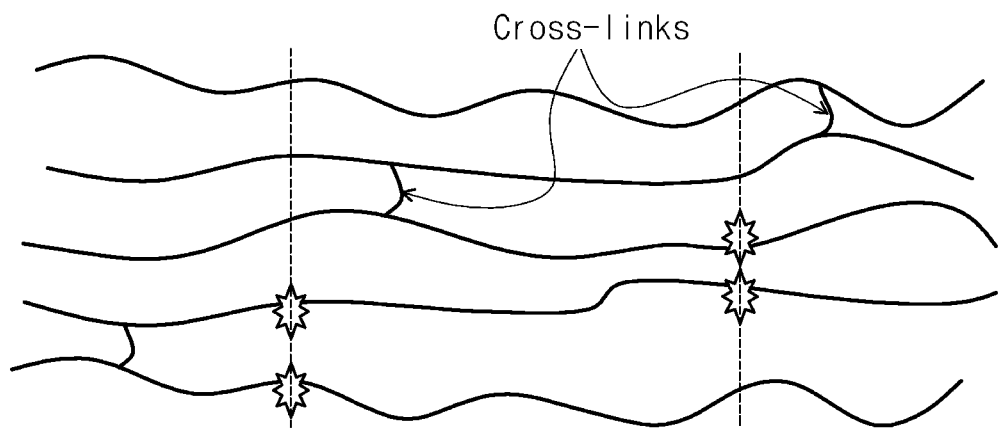

FIGS. 4 and 5 are views illustrating molecular bond breaking and cross-linking generated when ions are implanted in a surface of a component formed of a fluorine resin or a plastic material. When gas or solid ions are injected into the component formed of a fluorine resin or a plastic material, the ions penetrate into the surface of the component. Surface electrical conductivity is improved when the ions penetrate into the surface of the component. The improvement in surface electrical conductivity is caused by molecular bond breaking and cross-linking depending on an increase in C—C bonds and/or C=C bonds and an increase in radiation damage by the ions injected into the surface of the component.

For example, when ions are implanted in ETFE among fluorine resins, a cross-linking phenomenon in which C—H bonds and C—F bonds are decreased and C=C double bonds and C≡C triple bonds are increased arises. Due to this, the surface of the component has appropriate conductivity. Furthermore, the ion-implanted surface of the component has an ESD dissipative property by which static electricity is not generated almost at all. When ions are implanted in the surface of the component formed of a material containing a fluorine resin, the surface of the component has a resistance of about 1 M Ohms to about 1 G Ohms. In some embodiment, the resistance may be measured using a two-point probe, and the resistance may be measured per a unit distance (e.g., 1 cm). The resistance of about 1 M Ohms to about 1 G Ohms satisfies the SEMI standards. In some embodiments, an ion implantation process may be performed on the surface of the component so that an outer surface of the component has a surface resistance in a range of from about 1 M Ohms to 1 G Ohms. The outer surface of the component may serve as a dissipative material classified antistatic and considered as an ESD material which reduces static electricity. In some embodiments, ions implanted may be present at a surface portions of the component to a predetermined depth from the surface of the component. In some embodiments, the predetermined depth may be between 400 nm (nanometer) and 1 um (micrometer).

When the surface of the component has the dissipative property, static electricity due to friction with a treatment liquid L is not generated almost at all or is reduced. Even though a small amount of static electricity is generated, the static electricity may be removed through a ground path of the component when the component is grounded, because the surface of the component has certain conductivity. Furthermore, when the surface of the component has a resistance of about 1 M Ohms to about 1 G Ohms, generated static electricity may not be rapidly removed, and therefore occurrence of an arcing phenomenon may be minimized.

Figure 6:
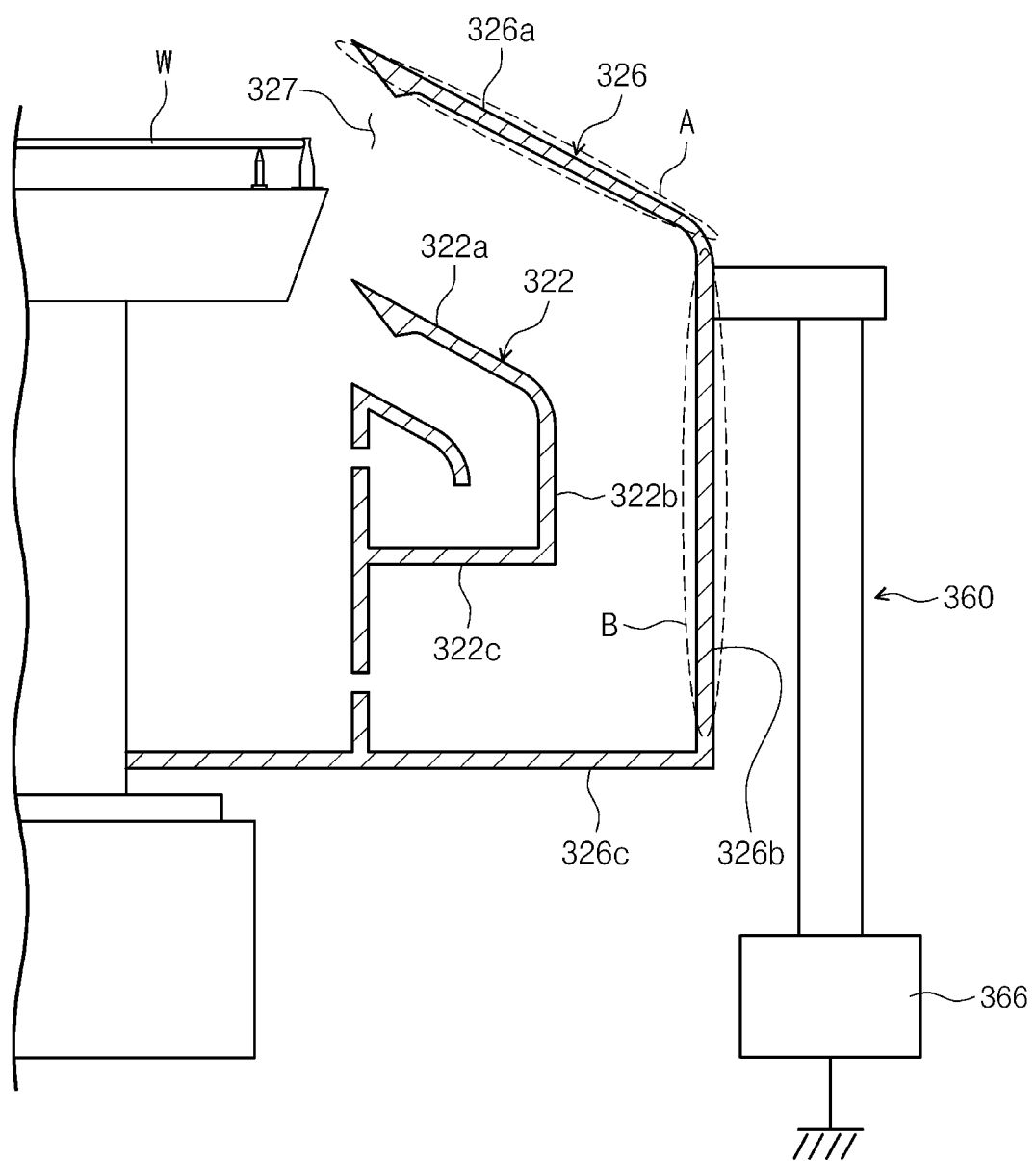
FIG. 6 is a view illustrating part of the substrate treating apparatus of FIG. 2.

FIG. 6 is a view illustrating part of the substrate treating apparatus of FIG. 2. The treatment vessel 320 may serve as an example of the above-described component. For example, the treatment vessel 320 may be formed of a material containing a fluorine resin or plastic. Furthermore, a surface of the treatment vessel 320 may be subjected to ion implantation. For example, an inner surface and an outer surface of the treatment vessel 320 may be subjected to ion implantation. The ion-implanted surface of the treatment vessel 320 may have a dissipative property. Furthermore, the ion-implanted surface of the treatment vessel 320 may have appropriate conductivity. In addition, the ion-implanted surface of the treatment vessel 320 may have a resistance of 1 M Ohms to 1 G Ohms.

Figure 7:
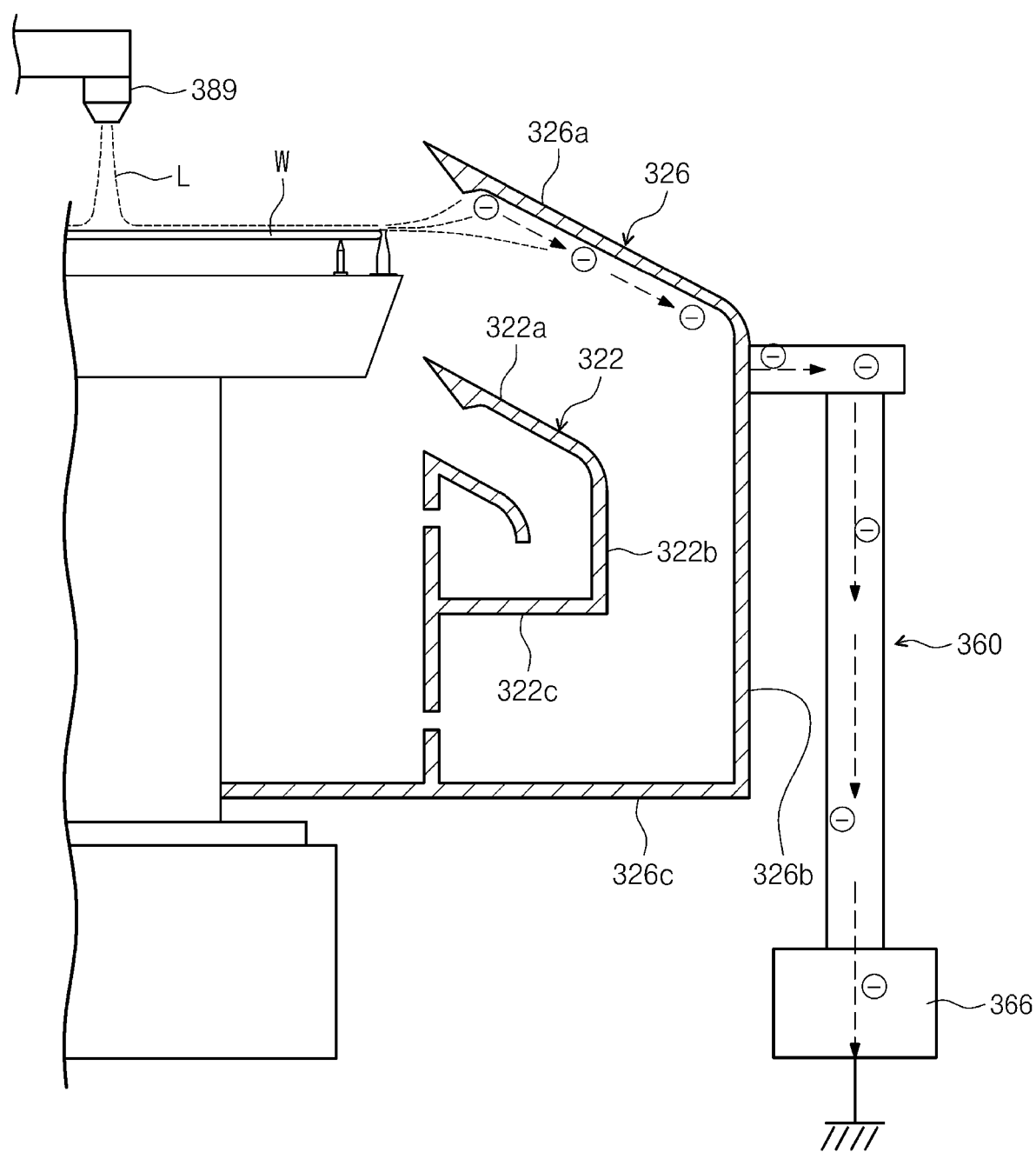
FIG. 7 is a view illustrating a process of removing static electricity generated during treatment of a substrate in the substrate treating apparatus of FIG. 2.

Accordingly, as illustrated in FIG. 7, static electricity is not generated almost at all even though a treatment liquid L is dispensed onto a rotating substrate W and scattered from the rotating substrate W and the scattered treatment liquid L generates friction with the treatment vessel 320. Even though static electricity is generated, the static electricity may be discharged through the treatment vessel 320 and the lifting unit 360. This is because the surface of the treatment vessel 320 has appropriate conductivity.

Furthermore, to efficiently remove static electricity, the amount (i.e., the number) of ions implanted in a surface (refer to area A of FIG. 6) of the second inclined portion 326a and the amount of ions implanted in a surface (refer to area B of FIG. 6) of the second sidewall portion 326b may differ from each other. This is to make surface resistance of the second inclined portion 326a and surface resistance of the second sidewall portion 326b different from each other. This is based on the principle that when a large amount of ions is implanted in a component, surface resistance of the component is lowered and when a small amount of ions is implanted in the component, surface resistance of the component is raised. In some embodiment, the number of ions implanted may be measured in a unit area (e.g., 1 cm$^2$).

For example, when the amount of ions implanted in the second inclined portion 326a is less than the amount of ions implanted in the second sidewall portion 326b, the magnitude of surface resistance of the second inclined portion 326a may be greater than the magnitude of surface resistance of the second sidewall portion 326b. That is, even though static electricity is generated by friction of the treatment liquid L with the second inclined portion 326a, the generated static electricity flows toward the second sidewall portion 326b having low surface resistance. Because the second sidewall portion 326b is coupled with the grounded lifting unit 360, the static electricity transmitted to the second sidewall portion 326b may be removed through a ground line connected with the lifting unit 360. That is, the surface resistance of the treatment vessel 320 may be gradually decreased with an approach to the area where the treatment vessel 320 is coupled with the lifting unit 360, and thus the generated static electricity may be effectively removed.

Similarly, the amount of ions implanted in a surface of the first inclined portion 322a and the amount of ions implanted in a surface of the first sidewall portion 322b may differ from each other. For example, the amount of ions implanted in the surface of the first inclined portion 322a may be less than the amount of ions implanted in the surface of the first sidewall portion 322b.

Figure 8:
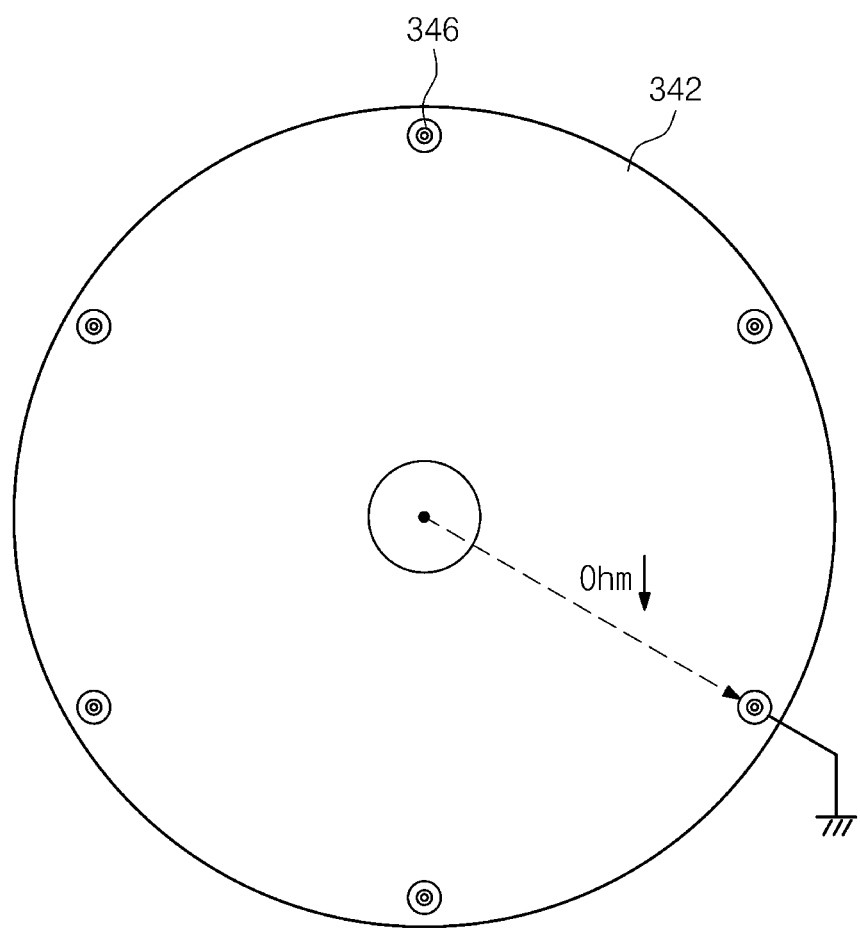
FIGS. 8 and 9 are top views of a support plate of FIG. 2.

FIG. 8 is a top view of the support plate of FIG. 2. The support plate 342 may serve as an example of the above-described component. For example, the support plate 342 may be formed of a material containing a fluorine resin or plastic. Furthermore, a surface of the support plate 342 may be subjected to ion implantation. For example, the upper surface of the support plate 342 may be subjected to ion implantation. The ion-implanted upper surface of the support plate 342 may have a dissipative property. Furthermore, the ion-implanted upper surface of the support plate 342 may have appropriate conductivity. In addition, the ion-implanted upper surface of the support plate 342 may have a resistance of 1 M Ohms to 1 G Ohms.

Figure 9:
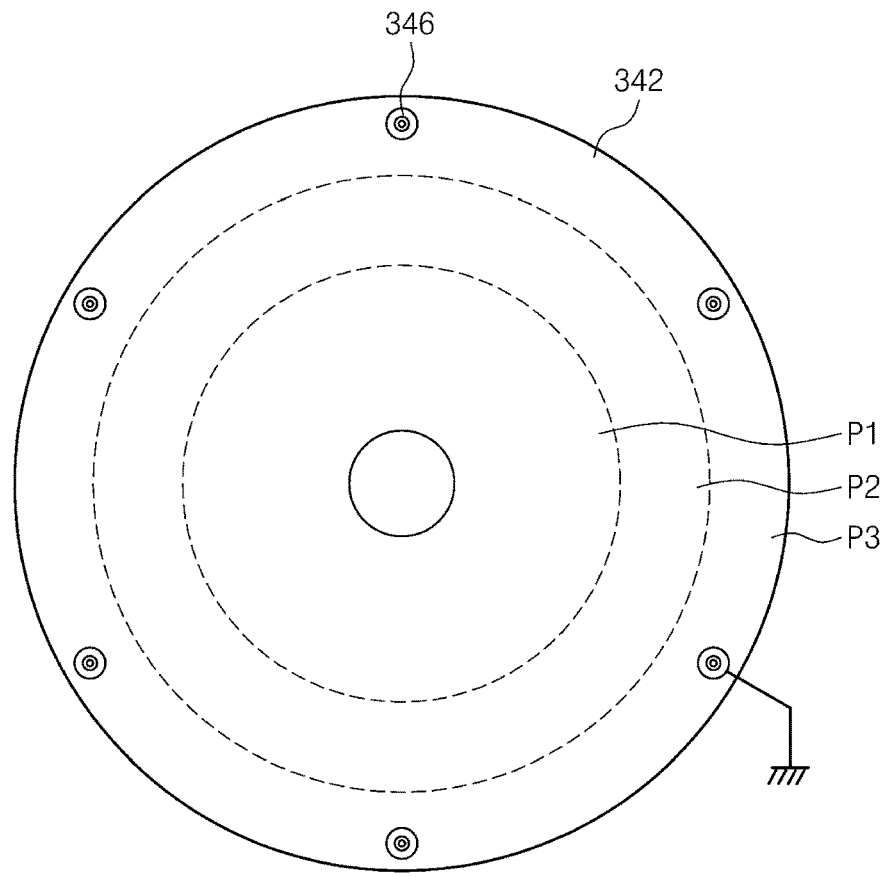

Furthermore, the amount of ions implanted in a central area of the support plate 342 when viewed from above and the amount of ions implanted in an edge area of the support plate 342 may differ from each other. For example, the amount of ions implanted in the central area of the support plate 342 may be less than the amount of ions implanted in the edge area of the support plate 342. In this case, surface resistance of the central area of the support plate 342 may be higher than surface resistance of the edge area of the support plate 342. The surface resistance of the upper surface of the support plate 342 may be gradually decreased along the radial direction of the support plate 342. For example, as illustrated in FIG. 9, the surface resistance of a central area P1 of the support plate 342 may be 100 M Ohms. The surface resistance of a middle area P2 of the support plate 342 may be 10 M Ohms. The surface resistance of an edge area P3 of the support plate 342 may be 1 M Ohms. Because the surface resistance of the central area P1 of the support plate 342 is higher than the surface resistance of the edge area P3 of the support plate 342, static electricity transmitted to the upper surface of the support plate 342 flows toward the edge area P3 of the support plate 342. As described above, the grounded chuck pins 346 are provided on the edge area P3 of the support plate 342. The surface resistance of the edge area P3 of the support plate 342 may be the same as the resistances of the contact portions 346a of the chuck pins 346. Accordingly, the static electricity transmitted to the support plate 342 may be effectively removed through the chuck pins 346.

Figure 10:
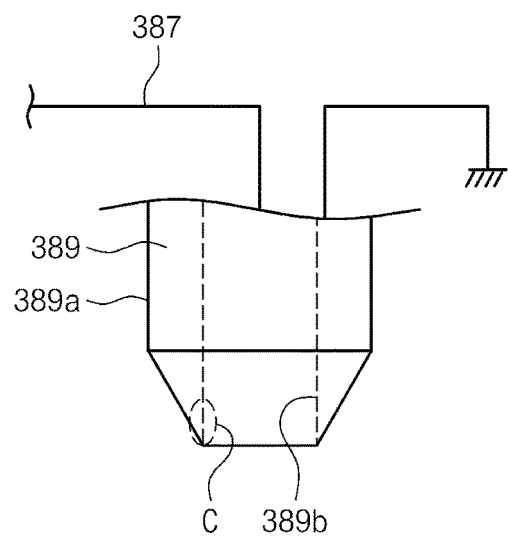
FIG. 10 is a view illustrating a nozzle of FIG. 2.

FIG. 10 is a view illustrating the nozzle of FIG. 2. The nozzle 389 may serve as an example of the above-described component. The nozzle 389 may be formed of a material containing a fluorine resin or plastic. A surface of the nozzle 389 may be subjected to ion implantation. For example, an outer surface 389a of the nozzle 389 may be subjected to ion implantation. In some embodiments, the nozzle 389 may include a discharge passage 389b. The discharge passage 389b is formed in the nozzle 389, and a treatment liquid L flows through the discharge passage 389b. The treatment liquid L touches the discharge passage 389b, and thus to reduce a static electricity due to friction between the discharge passage 389b and the treatment liquid L flowing therethrough, ion implantation (refer to area C of FIG. 10) is performed on the discharge passage 389b. The ion-implanted outer surface 389a of the nozzle 389 and the ion-implanted discharge passage 389b of the nozzle 389 may have a dissipative property. The ion-implanted outer surface 389a of the nozzle 389 and the ion-implanted discharge passage 389b of the nozzle 389 may have surface resistance to have a dissipative property. The ion-implanted outer surface 389a and the ion-implanted discharge passage 389b of the nozzle 389 may have a surface resistance of 1 M Ohms to 1 G Ohms.

Figure 11:
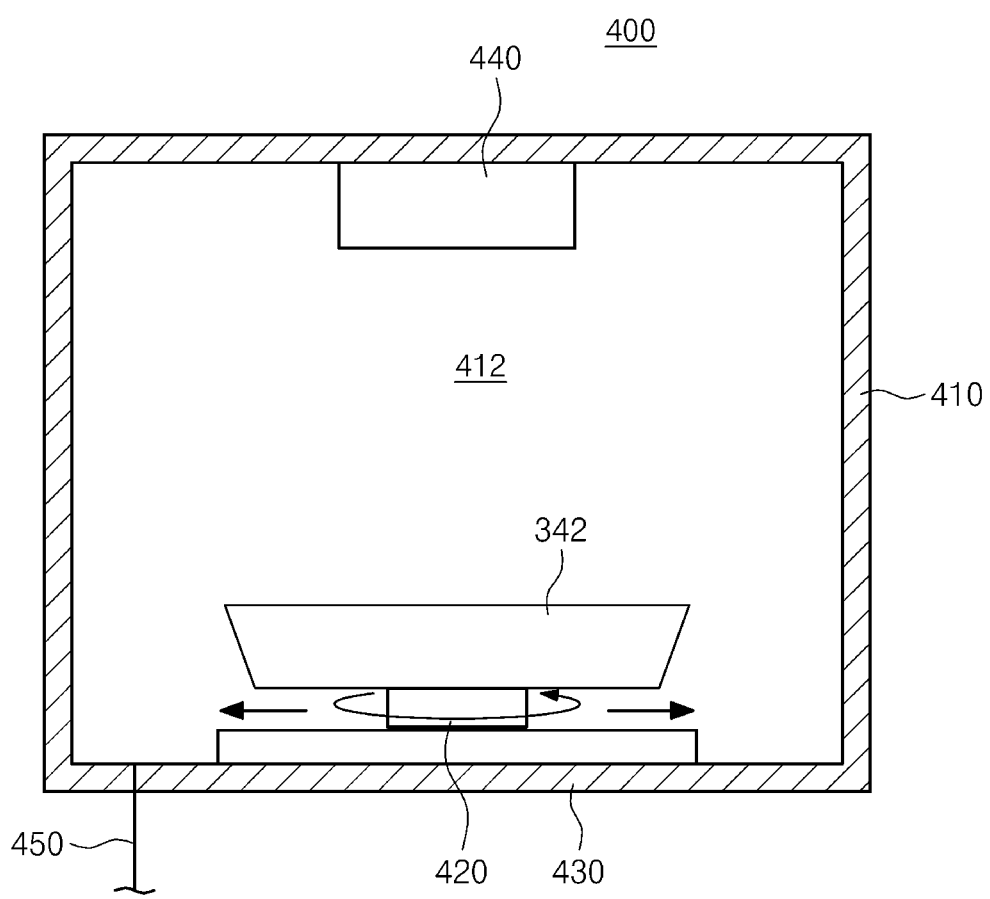
FIG. 11 is a view illustrating an ion implantation apparatus according to an embodiment of the inventive concept.

FIG. 11 is a view illustrating an ion implantation apparatus according to an embodiment of the inventive concept. Referring to FIG. 11, the ion implantation apparatus 400 according to the embodiment of the inventive concept may include a housing 410, a rotary chuck 420, a moving rail 430, an ion beam emitting unit 440, and an exhaust line 450.

The housing 410 may have an inner space 412. The rotary chuck 420 may support and rotate the above-described component (e.g., the support plate 342) in the inner space 412. The moving rail 430 may laterally move the rotary chuck 420. The ion beam emitting unit 440 may emit an ion beam to the component supported on the rotary chuck 420. The exhaust line 450 may be connected with the housing 410 and may discharge gas G or by-products generated in the inner space 412 outside the housing 410.

Figure 12:
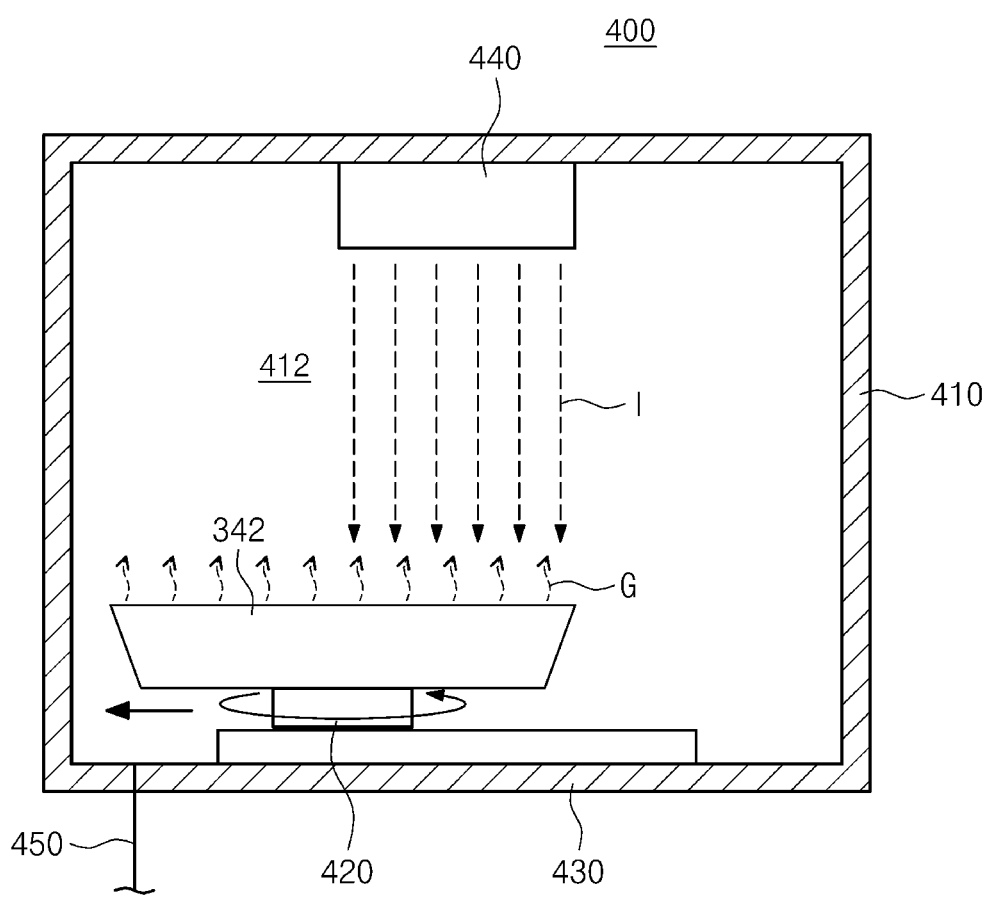
FIG. 12 is a view illustrating a state in which the ion implantation apparatus of FIG. 11 performs ion implantation on a component.

FIG. 12 is a view illustrating a state in which the ion implantation apparatus of FIG. 11 performs ion implantation on the component. Referring to FIG. 12, in an ion implantation method according to an embodiment of the inventive concept, the component 342 may be supported on the rotary chuck 420 and may be rotated in one direction by the rotary chuck 420. The ion beam emitting unit 440 may emit an ion beam to the rotating component 342. At this time, the ion beam emitting unit 440 may emit an ion beam containing a selected one of gas ions of an inert gas such as N2, H2 and Ar and solid ions to the component 342. For example, to lower surface resistance of the component 342, the ion beam emitting unit 440 may emit an ion beam containing solid ions to the component 342. In contrast, to raise surface resistance of the component 342, the ion beam emitting unit 440 may emit an ion beam containing gas ions to the component 342.

The ion beam may be emitted to the component 342 from a position eccentrically located off the center of rotation of the component 342 when viewed from above. When the ion beam is emitted in such a way, overheating of the component 342 due to concentration of the ion beam on the component 342 may be minimized.

When the ion beam is emitted to the component 342, F and H disconnected by ions are generated as out gas G. However, according to an embodiment of the inventive concept, the component 342 may be rotated by the rotary chuck 420 while the ion beam is emitted, and therefore the out gas G generated during the ion implantation may be moved away from the component 342 by a gas flow generated by the rotation of the rotary chuck 420 or the component 342.

Figure 13:
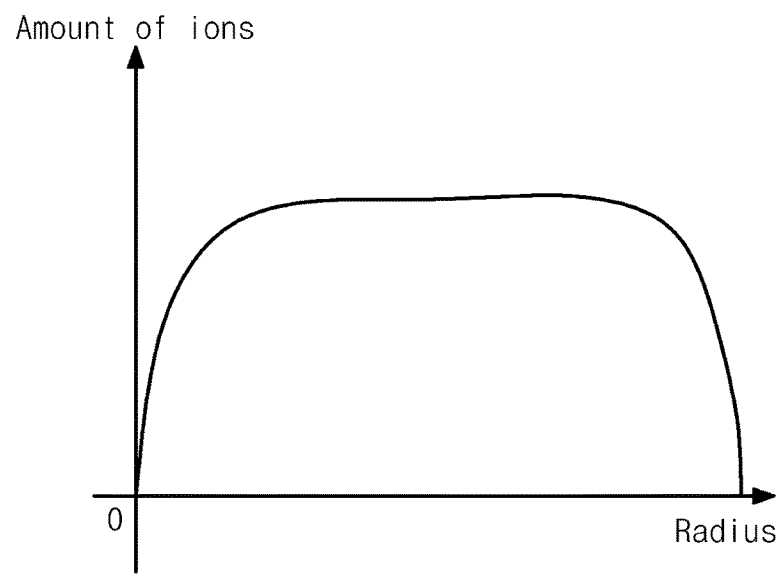
FIG. 13 is a view illustrating one example of the amount of ions delivered to the component along a radial direction of the component.
Figure 14:
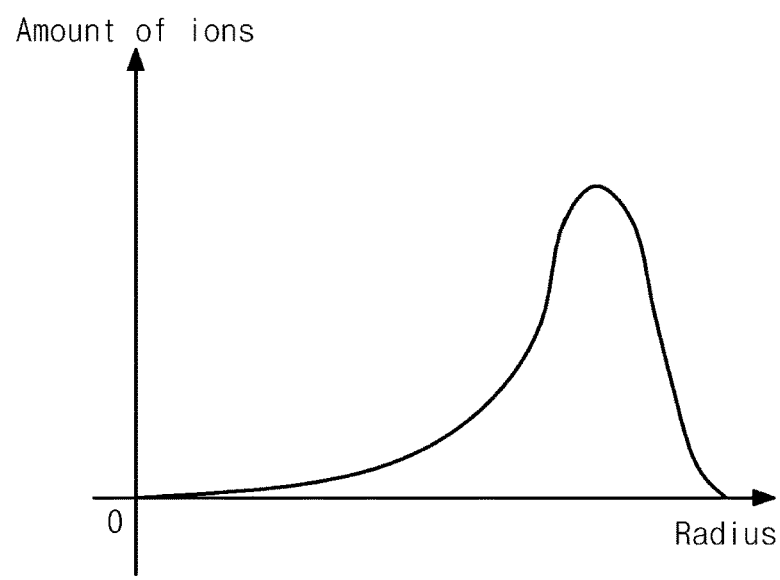
FIG. 14 is a view illustrating another example of the amount of ions delivered to the component along the radial direction of the component.

FIG. 13 is a view illustrating one example of the amount of ions delivered to the component along a radial direction of the component. Specifically, FIG. 13 is a view illustrating the amount of ions that the ion beam emitting unit 440 emits to the component 342. As illustrated in FIG. 13, the amount of ions emitted to the surface of the component 342 may be constant along the radial direction of the component 342. However, the amount of ions emitted to the surface of the component 342 is not limited thereto. For example, to generate a gradient of surface resistance of the component 342 as described above, the amount of ions delivered may be varied along the radial direction of the component 342 as illustrated in FIG. 14. For example, an ion beam may be emitted to the component 342 such that the amount of ions implanted in a central area of the component 342 and the amount of ions implanted in an edge area of the component 342 differ from each other. For example, an ion beam may be emitted to the component 342 such that the amount of ions implanted in the central area of the component 342 is less than the amount of ions implanted in the edge area of the component 342.

As described above, according to the embodiments of the inventive concept, a substrate may be efficiently treated.

Further, according to the embodiments of the inventive concept, generation of static electricity may be minimized in a process of treating a substrate.

Furthermore, according to the embodiments of the inventive concept, static electricity generated in a process of treating a substrate may be effectively removed.

Moreover, according to the embodiments of the inventive concept, a component that has chemical resistance and heat resistance of a fluorine resin or plastic and that is capable of minimizing generation of static electricity may be manufactured.

In addition, according to the embodiments of the inventive concept, a component that has chemical resistance and heat resistance of a fluorine resin or plastic and that is capable of effectively removing generated static electricity may be manufactured.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a process chamber configured to perform a liquid treatment process by dispensing a treatment liquid onto the substrate; and
   wherein the process chamber includes a plurality of components which are touched by the treatment liquid, and
   wherein at least one of the plurality of components includes fluorine resin and has a surface implanted with ions.

2. The apparatus of claim 1,
   wherein the apparatus further comprises:
   a treatment vessel provided in a container shape that is open at a top of the container shape, the treatment vessel having a treatment space in which the substrate is treated, and
   wherein the treatment vessel is one of the plurality of components.

3. The apparatus of claim 2, further comprising:
   a lifting unit configured to move the treatment vessel in an up/down direction, the lifting unit being grounded,
   wherein the treatment vessel is electrically connected to the lifting unit.

4. The apparatus of claim 3,
   wherein the treatment vessel includes:
   a sidewall portion coupled to the lifting unit; and
   an inclined portion extending upwardly in an inclined direction from an upper end of the sidewall portion, and
   wherein a first number of implanted ions per unit area at a surface of the inclined portion and a second number of implanted ions per unit area at a surface of the sidewall portion differ from each other.

5. The apparatus of claim 4,
   wherein the first number is less than the second number.

6. The apparatus of claim 1,
   wherein the apparatus further comprises:
   a support plate configured to support the substrate in the process chamber; and
   a chuck pin installed on the support plate and configured to hold the substrate, and
   wherein the support plate is one of the plurality of components.

7. The apparatus of claim 6,
   wherein the chuck pin is grounded, and
   wherein the support plate is electrically connected to the chuck pin.

8. The apparatus of claim 7,
   wherein a first number of implanted ions per unit area at a central area of the support plate when viewed from above and a second number of implanted ions per unit area at an edge area of the support plate differ from each other.

9. The apparatus of claim 8,
   wherein the first number is less than the second number.

10. The apparatus of claim 6,
    wherein the chuck pin includes:
    a contact portion contacting the substrate; and
    a ground portion electrically connected to the contact portion, the ground portion being grounded, and
    where resistances of the contact portion and the ground portion differ from each other.

11. The apparatus of claim 10,
    wherein the resistance of the contact portion is higher than the resistance of the ground portion.

12. The apparatus of claim 1,
    wherein the apparatus further comprises:
    a support unit configured to support the substrate in the process chamber; and
    a nozzle configured to dispense the treatment liquid onto the support unit, and
    wherein the nozzle is one of the plurality of components, and
    wherein the implanted ions are disposed at an outer surface of the nozzle.

13. The apparatus of claim 12,
    wherein the nozzle is grounded, and
    wherein the nozzle include a discharge passage through which the treatment liquid flows,
    wherein the implanted ions are disposed at a surface of the discharge passage which is touched by the treatment liquid flowing through the nozzle.

14. An apparatus for treating a substrate, the apparatus comprising:
    a treatment vessel having a treatment space;
    a support unit configured to support the substrate in the treatment space, the support unit having a support plate; and a liquid dispensing unit including a nozzle configured to dispense a treatment liquid onto the substrate supported on the support unit, wherein at least one of the treatment vessel, the support plate, or the nozzle is formed of a material containing a fluorine resin or plastic, and a surface of the at least one of the treatment vessel, the support plate, and the nozzle is implanted with ions, and wherein the at least one of the treatment vessel, the support plate, and the nozzle implanted with ions is configured to prevent static electricity being generated.

15. The apparatus of claim 14,
wherein the treatment vessel is electrically connected to a lifting unit configured to move the treatment vessel in an up/down direction, the lifting unit being grounded, and wherein surface resistance, per unit distance, of the treatment vessel is gradually decreased toward an area where the treatment vessel is coupled with the lifting unit.

16. The apparatus of claim 14,
wherein surface resistance, per unit distance, of a central area of the support plate when viewed from above is higher than surface resistance, per unit distance, of an edge area of the support plate.

17. The apparatus of claim 16,
wherein the support unit includes a chuck pin installed on the support plate and configured to hold the substrate, and wherein the chuck pin is grounded and electrically connected to the support plate.

18. The apparatus of claim 17, wherein the chuck pin includes:
a contact portion configured to contact the substrate; and
a ground portion electrically connected to the contact portion, the ground portion being grounded, and wherein resistance of the contact portion is higher than resistance of the ground portion.

19. An apparatus for treating a substrate, the apparatus comprising:
a treatment vessel having a treatment space;
a support unit configured to support the substrate in the treatment space, the support unit having a support plate; and
a liquid dispensing unit including a nozzle configured to dispense a treatment liquid onto the substrate supported on the support unit, wherein the treatment vessel and the support plate are formed of a material containing a fluorine resin and are implanted with ions to have a surface resistance, per unit distance, of 1 M Ohms to 1 G Ohms.

20. The apparatus of claim 19,
wherein the treatment vessel is electrically connected to a lifting unit configured to move the treatment vessel in an up/down direction, the lifting unit being grounded, wherein the treatment vessel includes a sidewall portion coupled to the lifting unit and an inclined portion extending from the sidewall portion in an upwardly inclined direction, and wherein surface resistance, per unit distance, of the inclined portion is higher than surface resistance, per unit distance, of the sidewall portion.

* * * * *